United States Patent
Choi et al.

(10) Patent No.: US 9,748,094 B2
(45) Date of Patent: Aug. 29, 2017

(54) SEMICONDUCTOR COMPOUND STRUCTURE AND METHOD OF FABRICATING THE SAME USING GRAPHENE OR CARBON NANOTUBES, AND SEMICONDUCTOR DEVICE INCLUDING THE SEMICONDUCTOR COMPOUND STRUCTURE

(75) Inventors: Jun-hee Choi, Seongnam-si (KR); Un-jeong Kim, Osan-si (KR); Sang-jin Lee, Anyang-si (KR)

(73) Assignee: SAMSUNG ELECTRONICS CO., LTD., Suwon (KR)

( * ) Notice: Subject to any disclaimer, the term of this patent is extended or adjusted under 35 U.S.C. 154(b) by 254 days.

(21) Appl. No.: 13/095,122

(22) Filed: Apr. 27, 2011

(65) Prior Publication Data
US 2012/0056237 A1 Mar. 8, 2012

(30) Foreign Application Priority Data

Sep. 3, 2010 (KR) .......................... 10-2010-0086586

(51) Int. Cl.
*H01L 33/08* (2010.01)
*H01L 21/02* (2006.01)
(Continued)

(52) U.S. Cl.
CPC .. *H01L 21/02538* (2013.01); *H01L 21/02422* (2013.01); *H01L 21/02444* (2013.01);
(Continued)

(58) Field of Classification Search
CPC ......... B82Y 20/00; B82Y 40/00; B82Y 15/00; H01L 33/18; H01L 21/02603;
(Continued)

(56) References Cited

U.S. PATENT DOCUMENTS

2003/0138983 A1* 7/2003 Biwa et al. ..................... 438/46
2006/0105200 A1* 5/2006 Poplavskyy et al. ......... 428/690
(Continued)

FOREIGN PATENT DOCUMENTS

JP          2003-217516 A    7/2003
KR    10-2005-0006632 A      1/2005
(Continued)

OTHER PUBLICATIONS

Kim, Yong-Jim et al. Vertically aligned ZnO nanostructures grown on graphene layers. Applied Physics Letters 95, 213101, 2009.*
(Continued)

*Primary Examiner* — Davienne Monbleau
*Assistant Examiner* — Leslie Pilar Cruz
(74) *Attorney, Agent, or Firm* — Sughrue Mion, PLLC

(57) ABSTRACT

A semiconductor compound structure and a method of fabricating the semiconductor compound structure using graphene or carbon nanotubes, and a semiconductor device including the semiconductor compound structure. The semiconductor compound structure includes a substrate; a buffer layer disposed on the substrate, and formed of a material including carbons having hexagonal crystal structures; and a semiconductor compound layer grown and formed on the buffer layer.

12 Claims, 5 Drawing Sheets

(51) Int. Cl.
*H01L 33/24* (2010.01)
*H01L 29/16* (2006.01)

(52) U.S. Cl.
CPC .............. *H01L 33/08* (2013.01); *H01L 33/24* (2013.01); *H01L 29/1606* (2013.01)

(58) Field of Classification Search
CPC . H01L 29/0665; H01L 29/0676; H01L 33/08; H01L 33/24; H01L 33/06; H01L 27/153; H01L 31/0232; H01L 31/055; H01L 33/00; H01L 29/0669; H01L 29/0673; H01L 29/0684; H01L 51/008; H01L 33/26
USPC .............. 257/103, E33.008, E29.07, E51.04; 977/755, 759
See application file for complete search history.

(56) References Cited

U.S. PATENT DOCUMENTS

| | | | |
|---|---|---|---|
| 2007/0111368 A1* | 5/2007 | Zhang | B82Y 10/00 438/99 |
| 2008/0036038 A1* | 2/2008 | Hersee et al. | 257/615 |
| 2008/0149914 A1* | 6/2008 | Samuelson et al. | 257/9 |
| 2008/0210956 A1* | 9/2008 | Kim | 257/88 |
| 2008/0276987 A1* | 11/2008 | Flood | H01L 31/03528 136/256 |
| 2009/0108251 A1* | 4/2009 | Kabir | 257/14 |
| 2010/0078055 A1* | 4/2010 | Vidu et al. | 136/244 |
| 2010/0163840 A1* | 7/2010 | Seifert et al. | 257/13 |
| 2010/0255984 A1* | 10/2010 | Sutter et al. | 502/185 |

FOREIGN PATENT DOCUMENTS

| | | |
|---|---|---|
| KR | 10-2005-0045216 A | 5/2005 |
| KR | 10-0561491 B1 | 3/2006 |
| KR | 10-0709112 B1 | 4/2007 |
| KR | 10-2008-0064797 A | 7/2008 |
| KR | 10-0846514 B1 | 7/2008 |
| KR | 10-2009-0032211 A | 4/2009 |
| KR | 1020100084482 A | 7/2010 |
| WO | WO 2010014032 A1 * | 2/2010 |

OTHER PUBLICATIONS

Akira Ishii et al., "Computational study for growth of GaN on graphite as 3D growth on 2D material", Physica Status Solidi, No. 7, 2010, p. 347-350 (published online Nov. 4, 2009).

Xuesong Li et al., "Large-Area Synthesis of High-Quality and Uniform Graphene Films on Copper Foils", Science, vol. 324, Jun. 5, 2009, p. 1312-1314.

Communication dated Jan. 3, 2016, issued by the Korean Intellectual Property Office in counterpart Korean Application No. 10-2010-0086586.

* cited by examiner

SEMICONDUCTOR COMPOUND STRUCTURE AND METHOD OF FABRICATING THE SAME USING GRAPHENE OR CARBON NANOTUBES, AND SEMICONDUCTOR DEVICE INCLUDING THE SEMICONDUCTOR COMPOUND STRUCTURE

CROSS-REFERENCE TO RELATED APPLICATIONS

This application claims the benefit of Korean Patent Application No. 10-2010-0086586, filed on Sep. 3, 2010, in the Korean Intellectual Property Office, the disclosure of which is incorporated herein in its entirety by reference.

BACKGROUND

1. Field

Exemplary embodiments consistent with the present disclosure relate to semiconductor compound structures and methods of manufacturing the same, and more particularly, to semiconductor compound structures and methods of manufacturing the semiconductor compound structures using graphene or carbon nanotubes, and semiconductor devices including the semiconductor compound structures.

2. Description of the Related Art

When light emitting devices are fabricated using a sapphire substrate or a silicon substrate, fabrication costs increase. To address the above problem, fabrication of light emitting devices by using an amorphous substrate such as a glass substrate has been tried. However, it is difficult to epitaxially grow a group III-V semiconductor compound such as gallium nitride (GaN) on the amorphous substrate.

SUMMARY

Provided are semiconductor compound structures and methods of manufacturing the semiconductor compound structures using graphene or carbon nanotubes, and semiconductor devices including the semiconductor compound structures.

Additional aspects will be set forth in part in the description which follows and, in part, will be apparent from the description, or may be learned by practice of the presented exemplary embodiments.

According to an aspect of an exemplary embodiment, a semiconductor compound structure includes: a substrate; a buffer layer disposed on the substrate, and formed of a material including carbons having hexagonal crystal structures; and a semiconductor compound layer grown and formed on the buffer layer.

The substrate may include an amorphous substrate. The semiconductor compound structure may further include a wetting layer for easily depositing the semiconductor compound layer on the buffer layer.

The buffer layer may include graphene or graphite. The semiconductor compound layer may be formed as a film or a plurality of rods. The semiconductor compound structure may further include a catalyst layer for growing the graphene or graphite on the substrate.

The buffer layer may include carbon nanotubes (CNTs). The CNTs may be arranged on the substrate in perpendicular or parallel direction. The semiconductor compound layer may be formed to surround or cover the CNTs. The semiconductor compound structure may further include a catalyst layer for growing the CNTs on the substrate.

The semiconductor compound layer may include a group III-V compound semiconductor material.

According to another aspect of an exemplary embodiment, a method of fabricating a semiconductor compound structure, the method includes: preparing an amorphous substrate; forming a buffer layer that is formed of a material including carbons having hexagonal crystal structures on the amorphous substrate; and forming a semiconductor compound layer on the buffer layer.

The method may further include forming a wetting layer on the buffer layer by physical vapor deposition (PVD).

According to another aspect of an exemplary embodiment, a semiconductor device includes: a substrate; a lower electrode disposed on the substrate; a buffer layer disposed on the lower electrode, and formed of a material including carbons having hexagonal crystal structures; a light emission layer formed on the buffer layer, and formed of a semiconductor compound; an insulating layer formed to bury a lower portion of the light emission layer on the buffer layer; and an upper electrode formed to cover the light emission layer and the insulating layer.

The light emission layer may include a first semiconductor layer formed on the buffer layer, an active layer formed on the first semiconductor layer, and a second semiconductor layer formed on the active layer. The semiconductor device may further include a resistive layer between the lower electrode and the buffer layer.

The lower electrode may be disposed to be separated from the substrate, and the insulating layer may fill a space between the substrate and the lower electrode.

BRIEF DESCRIPTION OF THE DRAWINGS

These and/or other aspects will become apparent and more readily appreciated from the following description of the exemplary embodiments, taken in conjunction with the accompanying drawings of which.

DETAILED DESCRIPTION OF EXEMPLARY EMBODIMENTS

Figure 1:
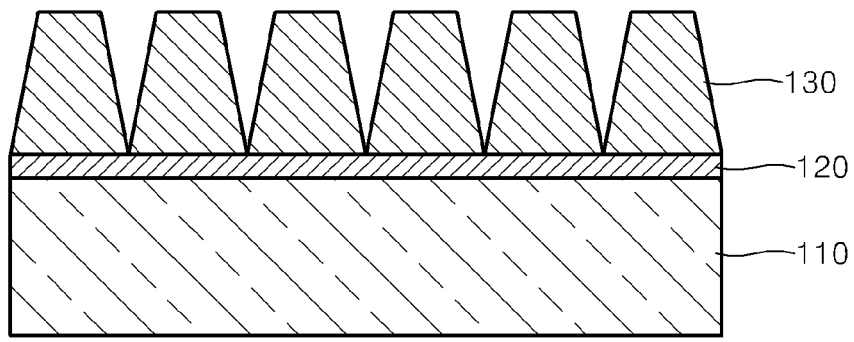
FIG. 1 is a cross-sectional view of a semiconductor compound structure according to an exemplary embodiment.

Reference will now be made in detail to exemplary embodiments, examples of which are illustrated in the accompanying drawings, wherein like reference numerals refer to the like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

FIG. 1 is a cross-sectional view of a semiconductor compound structure according to an exemplary embodiment.

Referring to FIG. 1, the semiconductor compound structure of the present exemplary embodiment includes a substrate 110, a buffer layer 120 deposited on the substrate 110, and a semiconductor compound layer 130 formed on the buffer layer 120. In the present exemplary embodiment, the substrate 110 may be an amorphous substrate. For example, a glass substrate may be used as the substrate 110. However, the exemplary embodiment is not limited thereto, and an amorphous substrate may be used as the substrate 110. The buffer layer 120 is formed on the substrate 110. The buffer layer 120 may be formed of a material including carbons that have hexagonal crystal structures. In the present exemplary embodiment, the buffer layer 120 may be formed of graphene or graphite. Here, graphite means a material having a structure, in which a plurality of graphene layers are stacked. The buffer layer 120 formed of the graphene or the graphite may be formed by being transferred onto the substrate 110, which will be described later.

The semiconductor compound layer 130 is grown on the buffer layer 120 formed of the graphene or the graphite. Here, the semiconductor compound layer 130 may be formed of a group III-V compound semiconductor material such as gallium nitride (GaN). The semiconductor compound layer 130 may be formed as a film or a plurality of rods. In more detail, when the graphene or the graphite forming the buffer layer 120 is formed as a plurality of domains on the substrate 110, the group III-V compound semiconductor material is grown on each of the domains so that the semiconductor compound layer 130 is formed to have the plurality of rods as shown in FIG. 1. On the other hand, although not shown in FIG. 1, when the graphene or the graphite forming the buffer layer 120 is formed as single crystals on the substrate 110, the semiconductor compound layer 130 may be formed as the film.

The semiconductor compound structure may be formed in following ways. For example, the substrate 110 such as the amorphous substrate is prepared, and the buffer layer 120 is formed on the substrate 110 by using the graphene or the graphite. Here, the buffer layer 120 may be formed by transferring the graphene or the graphite onto the substrate 110. The graphene or the graphite may be grown on a material having a low solid solubility of carbon, for example, copper foil, by using CH4. In addition, polyimide is coated on the graphene or the graphite, and then, the copper foil is removed. Then, when the substrate 110 is dipped in polyimide removal solution, the graphene or the graphite is transferred onto the substrate 110 to form the buffer layer 120.

Next, the group III-V compound semiconductor material such as GaN is grown on the buffer layer 120 formed of the graphene or the graphite to form the semiconductor compound layer 130. Here, GaN may be grown by using trimethyl gallium (TMG) and NH3, and growth of GaN is performed through a low temperature process of about 500 to about 600° C. and a high temperature process of about 1000 to about 1100° C. Here, the semiconductor compound layer 130 may be formed as the film or the plurality of rods according to the type of graphene or graphite forming the buffer layer 120.

In general, when the group III-V compound semiconductor material is formed on the amorphous substrate such as the glass substrate, epitaxial growth of the material may not be performed and semiconductor compound crystals are grown randomly. However, when the buffer layer 120 formed of the graphene or the graphite is formed on the substrate 110 as in the present exemplary embodiment, the epitaxial growth of the group III-V compound semiconductor material such as GaN may be performed on the buffer layer 120. Therefore, the amorphous substrate that is cheap such as the glass substrate may be used to grow the film or rods of the group III-V compound semiconductor material with low cost.

Figure 2:
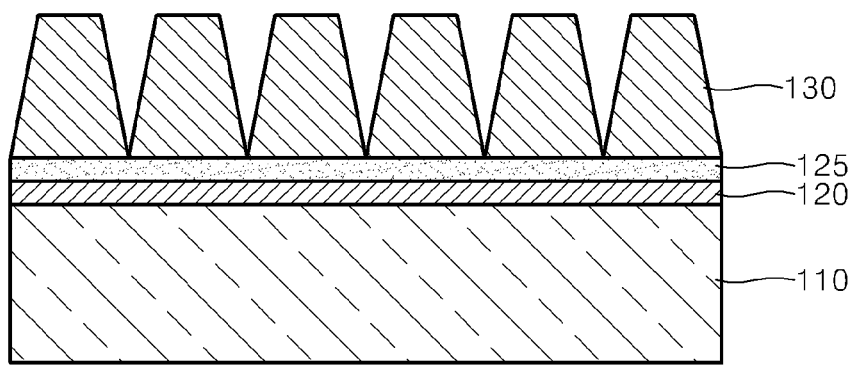
FIG. 2 is a cross-sectional view of a semiconductor compound structure according to another exemplary embodiment.

FIG. 2 is a cross-sectional view of a semiconductor compound structure according to another exemplary embodiment. Hereinafter, elements that are different from those of the previous exemplary embodiment will be described.

Referring to FIG. 2, the buffer layer 120 formed of the graphene or graphite is formed on the substrate 110, and a wetting layer 125 is formed on the buffer layer 120. Here, the wetting layer 125 is formed to easily deposit the semiconductor compound layer 130, which will be grown thereon, on the buffer layer 120. The wetting layer 125 may be formed by a physical vapor deposition (PVD) method such as a sputtering or an evaporation method. In more detail, when GaN is grown, the wetting layer 125 may be formed by depositing AN, ZnO, Al$_2$O$_3$, or GaN on the buffer layer 120 in the PVD method.

Figure 3:
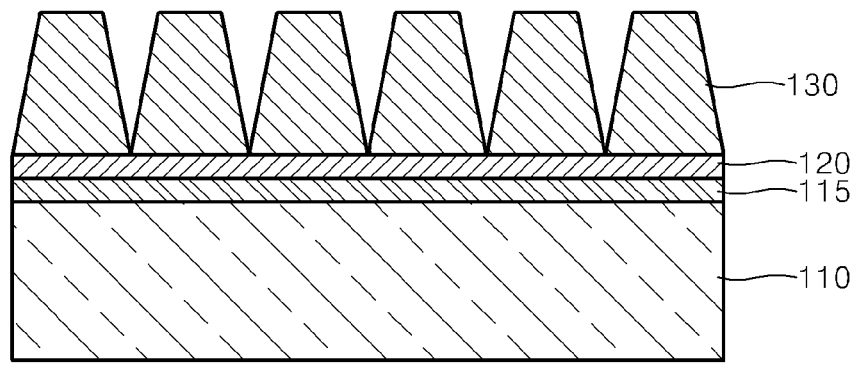
FIG. 3 is a cross-sectional view of a semiconductor compound structure according to another exemplary embodiment.

FIG. 3 is a cross-sectional view of a semiconductor compound structure according to another exemplary embodiment. Hereinafter, elements that are different from those of the previous exemplary embodiments will be described.

Referring to FIG. 3, a catalyst layer 115 is formed on the substrate 110, and the buffer layer 120 is formed on the catalyst layer 115. In addition, the semiconductor compound layer 130 is formed on the buffer layer 120. In the present exemplary embodiment, the buffer layer 120 is formed by growing the graphene or graphite. Here, the catalyst layer 115 is a metal layer formed to grow the buffer layer 120, and may be formed of, for example, Cu, Ni, or Invar that is an alloy of Fe and Ni. However, the exemplary embodiment is not limited thereto. On the other hand, although not shown in FIG. 3, the wetting layer 125 shown in FIG. 2 may be further formed on the buffer layer 120.

Figure 4:
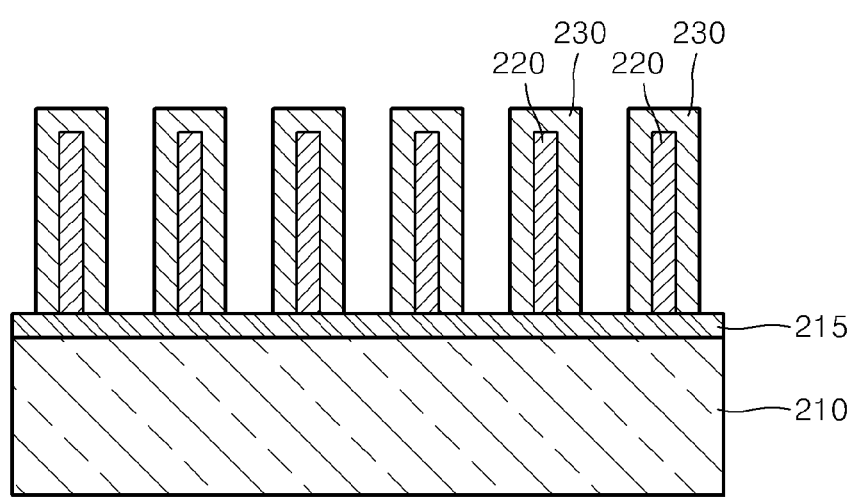
FIG. 4 is a cross-sectional view of a semiconductor compound structure according to another exemplary embodiment.

FIG. 4 is a cross-sectional view of a semiconductor compound structure according to another exemplary embodiment.

Referring to FIG. 4, the semiconductor compound structure according to the present exemplary embodiment includes a substrate 210, a catalyst layer 215 formed on the substrate 210, a buffer layer 220 formed on the catalyst layer 215, and a semiconductor compound layer 230 formed on the buffer layer 220. The substrate 210 may be an amorphous substrate. However, the exemplary embodiment is not limited thereto. The catalyst layer 215 is formed on the substrate 210. The catalyst layer 215 is a metal layer for growing carbon nanotubes (CNTs) that form the buffer layer 210, which will be described later, and may be formed of Cu, Ni, or Invar that is an alloy of Fe and Ni, for example. However, the exemplary embodiment is not limited thereto.

The buffer layer 220 is formed on the catalyst layer 215. The buffer layer 220 may be formed of a material including carbons having hexagonal crystal structures. In the present exemplary embodiment, the buffer layer 220 may be formed of CNTs. The buffer layer 220 may be formed by growing the CNTs on the catalyst layer 215 in a chemical vapor deposition (CVD) method. In this case, the CNTs that are grown may be arranged on the substrate 210 perpendicularly to the substrate 210.

The semiconductor compound layer 230 is grown on the buffer layer 220 that is formed of the CNTs. Here, the semiconductor compound layer 230 may be formed to surround or cover the CNTs forming the buffer layer 220. The semiconductor compound layer 230 may be formed of a group III-V compound semiconductor material such as GaN.

The semiconductor compound structure may be formed in following processes. The substrate 210 such as the amorphous substrate is prepared, and the catalyst layer 215 that is formed of, for example, Cu, Ni, or Invar, is formed on the substrate 210. Then, the CNTs are grown on the catalyst layer 215 to form the buffer layer 220. In addition, the group III-V compound semiconductor material such as GaN is grown on the buffer layer 220 formed of the CNTs to form the semiconductor compound layer 230.

As described above, when the buffer layer 220 formed of the CNTs is formed on the substrate 210, the epitaxial growth of the group III-V compound semiconductor material such as GaN may be performed on the buffer layer 220. Therefore, the group III-V compound semiconductor material may be grown with cheap expenses by using the amorphous substrate such as the glass substrate.

Figure 5:
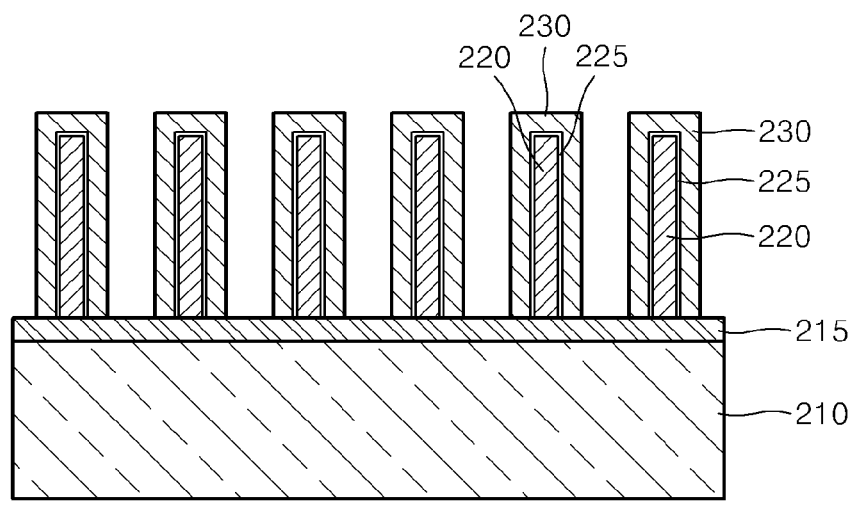
FIG. 5 is a cross-sectional view of a semiconductor compound structure according to another exemplary embodiment.

FIG. 5 is a cross-sectional view of a semiconductor compound structure according to another exemplary embodiment. Hereinafter, elements that are different from those of the previous exemplary embodiment illustrated in FIG. 4 will be described.

Referring to FIG. 5, the catalyst layer 215 is formed on the substrate 210, and the buffer layer 220 formed of CNTs is formed on the catalyst layer 215. In addition, a wetting layer 225 is formed on the buffer layer 220. Here, the wetting layer 225 makes the semiconductor compound layer 230 that will be grown thereon easily deposited on the buffer layer 220, as described above. The wetting layer 225 may be formed by the PVD method. For example, when GaN is grown, the wetting layer 225 may be formed by depositing AN, ZnO, Al$_2$O$_3$, or GaN on the buffer layer 220 formed of the CNTs in the PVD method.

Figure 6:
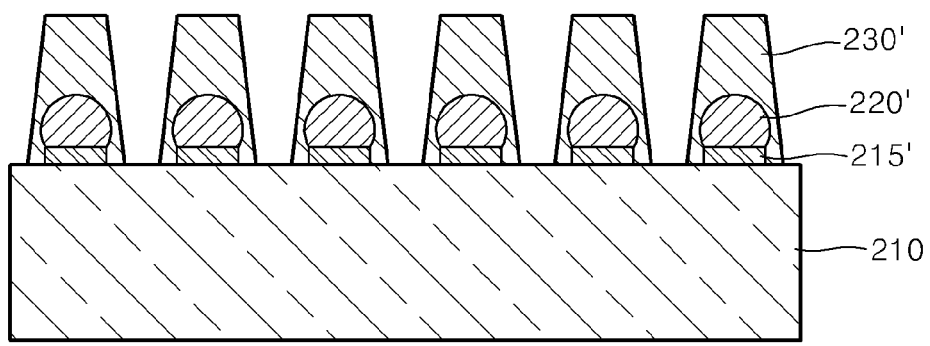
FIG. 6 is a cross-sectional view of a semiconductor compound structure according to another exemplary embodiment.

FIG. 6 is a cross-sectional view of a semiconductor compound structure according to another exemplary embodiment. Hereinafter, elements that are different from those of the previous exemplary embodiment illustrated in FIG. 4 will be described.

Referring to FIG. 6, a catalyst layer 215' is formed on the substrate 210, and a buffer layer 220' formed of CNTs is formed on the catalyst layer 215'. In the present exemplary embodiment, the CNTs forming the buffer layer 220' are arranged on the substrate 210 in parallel with the substrate 210. FIG. 6 shows a cross-section in which the CNTs forming the buffer layer 220' are arranged in parallel on the substrate 210. In addition, a semiconductor compound layer 230' is grown on the buffer layer 220' that is formed of the CNTs arranged in parallel. Here, the semiconductor compound layer 230' may be formed to surround or cover the CNTs. The semiconductor compound layer 230' may be formed of, for example, a group III-V compound semiconductor material such as GaN. On the other hand, although not shown in FIG. 6, the wetting layer 225 shown in FIG. 5 may be further formed on the buffer layer 220.

The semiconductor compound structure described above may be applied to semiconductor devices such as p-n junction devices. Here, the p-n junction devices may include light emitting devices or solar cells. Hereinafter, the light emitting device will be described as a representative example.

Figure 7:
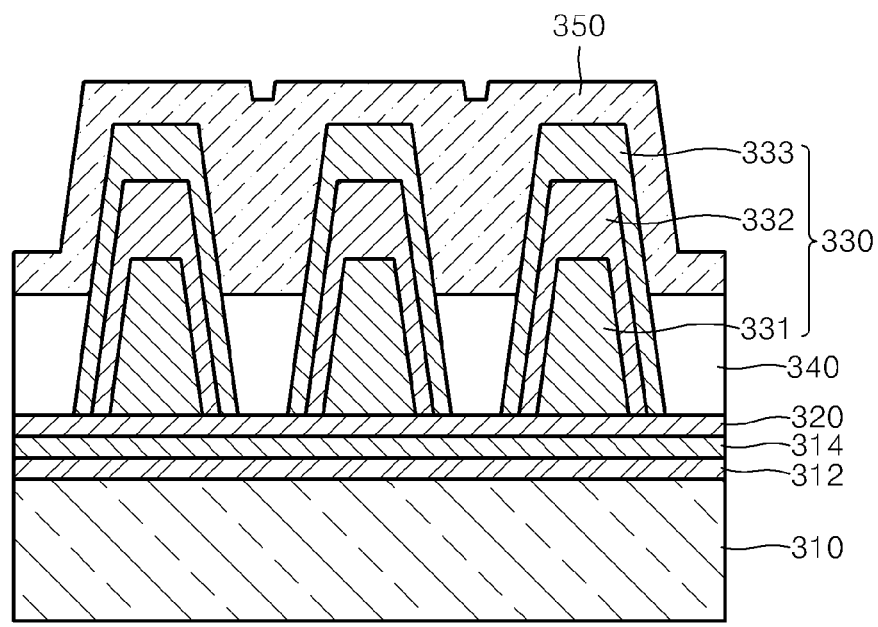
FIG. 7 is a cross-sectional view of a light emitting device according to an exemplary embodiment.

FIG. 7 is a cross-sectional view of a light emitting device according to an exemplary embodiment.

Referring to FIG. 7, the light emitting device of the present exemplary embodiment includes a substrate 310, a lower electrode 312 formed on the substrate 310, a buffer layer 320 formed on the lower electrode 312, a light emission layer 330 formed on the buffer layer 320, an insulating layer 340 formed on the buffer layer 320 so as to bury a lower portion of the light emission layer 330, and an upper electrode 350 formed to cover the light emission layer 330 and the insulating layer 340.

In more detail, an amorphous substrate such as the glass substrate may be used as the substrate 310, or a crystal substrate may be used. The lower electrode 312 is formed on the substrate 310. The lower electrode 312 may be formed of, for example, Ti, or other various conductive materials. When a first semiconductor layer 331 that will be described later is a p-type semiconductor layer, the lower electrode 312 may be a p-type electrode, and when the first semiconductor layer 331 is an n-type semiconductor layer, the lower electrode 312 may be an n-type electrode. On the other hand, a resistive layer 314 may be additionally formed on the lower electrode. Here, the resistive layer 314 is to prevent excessive electric current from inducing into the light emission layer 330 from the lower electrode 312, and may be formed of, for example, a silicon oxide material.

The buffer layer 320 is formed on the resistive layer 314. The buffer layer 320 may be formed of a material including carbons having hexagonal crystal structures. In the present exemplary embodiment, the buffer layer 320 may be formed of graphene or graphite. The buffer layer 320 formed of the graphene or graphite may be formed by being transferred or grown. When the buffer layer 320 is formed by the growth, a catalyst layer (not shown) may be further formed on a lower surface of the buffer layer 320.

The light emission layer 330 is formed on the buffer layer 320 that is formed of the graphene or graphite. The light emission layer 330 may be formed by growing a group III-V compound semiconductor material such as GaN on the buffer layer 320. Here, the light emission layer 330 may be formed as a film or a plurality of rods according to the type of graphene or graphite forming the buffer layer 320. The light emission layer 330 may include the first semiconductor layer 331 formed on the buffer layer 320, an active layer 332 formed on the first semiconductor layer 331, and a second semiconductor layer 333 formed on the active layer 332. Here, the first semiconductor layer 331 may be a p-type semiconductor layer and the second semiconductor layer 333 may be an n-type semiconductor layer. Otherwise, the first semiconductor layer 331 may be an n-type semiconductor layer and the second semiconductor layer 333 may be a p-type semiconductor layer. The active layer 332 may be a semiconductor layer having a multi-quantum well structure.

The insulating layer 340 is formed on the buffer layer 320 so as to bury the lower portion of the light emission layer 330. The insulating layer 340 may be formed of, for example, photoresist, polyimide, or silicon oxide. However, the exemplary embodiment is not limited to the above examples. The upper electrode 350 is formed on upper surfaces of the light emission layer 330 and the insulating layer 340. The upper electrode 350 is formed to cover the second semiconductor layer 333 and the insulating layer 340. The upper electrode 350 may be formed of a transparent conductive material, for example, indium tin oxide (ITO). When the second semiconductor layer 333 is the p-type semiconductor layer, the upper electrode 350 may be a p-type electrode. In addition, when the second semiconductor layer 333 is the n-type semiconductor layer, the upper electrode 350 may be an n-type electrode. On the other hand, although not shown in FIG. 7, the wetting layer 125 illustrated in FIG. 2 may be further formed on the buffer layer 320.

Figure 8:
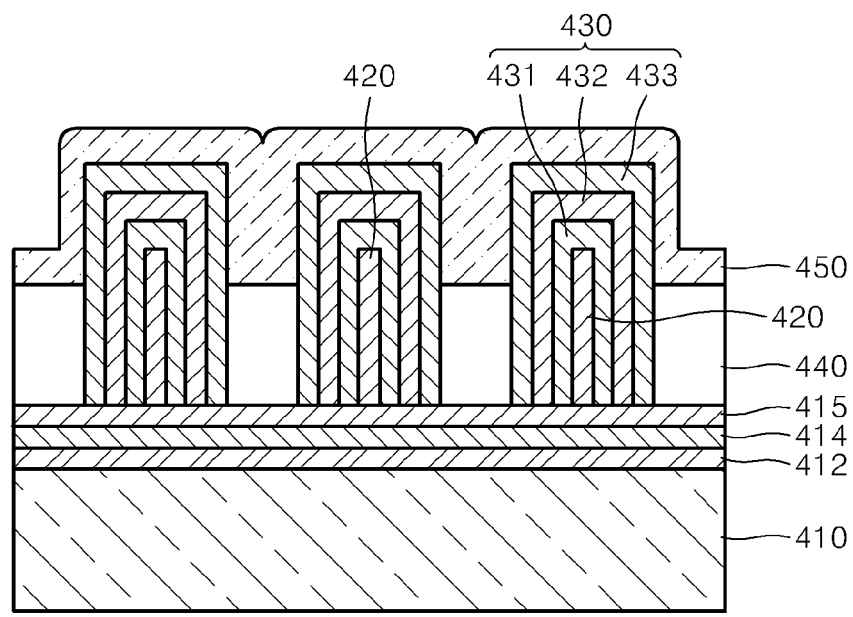
FIG. 8 is a cross-sectional view of a light emitting device according to another exemplary embodiment.

FIG. 8 is a cross-sectional view of a light emitting device according to another exemplary embodiment.

Referring to FIG. 8, the light emitting device of the present exemplary embodiment includes a substrate 410, a lower electrode 412 formed on the substrate 410, a buffer layer 420 formed on the lower electrode 412, a light emission layer 430 formed on the buffer layer 420, an insulating layer 440 formed on the buffer layer 420 to bury a lower portion of the light emission layer 430, and an upper electrode 450 formed to cover the light emission layer 430 and the insulating layer 440.

In more detail, an amorphous substrate such as the glass substrate may be used as the substrate 410, or a crystal substrate may be used. The lower electrode 412 is formed on the substrate 410. When a first semiconductor layer 431 that will be described later is a p-type semiconductor layer, the lower electrode 412 may be a p-type electrode, and when the first semiconductor layer 431 is an n-type semiconductor layer, the lower electrode 412 may be an n-type electrode. On the other hand, a resistive layer 414 may be additionally formed on the lower electrode 412.

A catalyst layer 415 is formed on the resistive layer 414. One purpose of the catalyst layer 415 is to grow the CNTs forming the buffer layer 420, and may be formed of, for example, Cu, Ni, or Invar that is an alloy of Fe and Ni. However, the exemplary embodiment is not limited thereto. The buffer layer 420 is formed on the catalyst layer 415. The buffer layer 420 may be formed of a material including carbons having hexagonal crystal structures. In the present exemplary embodiment, the buffer layer 420 may be formed of CNTs. The buffer layer 420 may be formed by growing the CNTs on the catalyst layer 415.

The light emission layer 430 is formed on the buffer layer 420 that is formed of the CNTs. The light emission layer 430 may be formed by growing a group III-V compound semiconductor material such as GaN on the buffer layer 420. Here, the light emission layer 430 may be formed to surround or cover the CNTs that form the buffer layer 420. The light emission layer 430 may include the first semiconductor layer 431 formed on the buffer layer 420, an active layer 432 formed on the first semiconductor layer 431, and a second semiconductor layer 433 formed on the active layer 432. Here, the first semiconductor layer 431 may be a p-type semiconductor layer and the second semiconductor layer 433 may be an n-type semiconductor layer. Otherwise, the first semiconductor layer 431 may be an n-type semiconductor layer and the second semiconductor layer 433 may be a p-type semiconductor layer. The active layer 432 may be a semiconductor layer having a multi-quantum well structure.

The insulating layer 440 is formed on the buffer layer 420 so as to bury the lower portion of the light emission layer 430. In addition, the upper electrode 450 that is formed of a transparent conductive material is formed on upper surfaces of the light emission layer 430 and the insulating layer 440. When the second semiconductor layer 433 is the p-type semiconductor layer, the upper electrode 450 may be a p-type electrode. In addition, when the second semiconductor layer 433 is the n-type semiconductor layer, the upper electrode 450 may be an n-type electrode. On the other hand, although not shown in FIG. 8, the wetting layer 225 illustrated in FIG. 5 may be further formed on the buffer layer 420.

Figure 9:
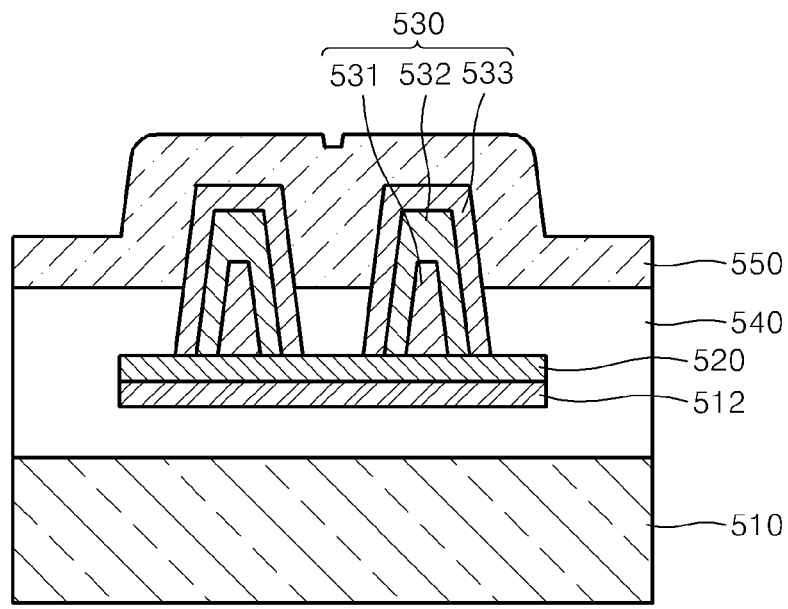
FIG. 9 is a cross-sectional view of a light emitting device according to another exemplary embodiment.

FIG. 9 is a cross-sectional view of a light emitting device according to another exemplary embodiment.

Referring to FIG. 9, the light emitting device of the present embodiment includes a substrate 510, a lower electrode 512 formed above the upper portion of the substrate 510, a buffer layer 520 formed on the lower electrode 512, a light emission layer 530 formed on the buffer layer 520, an insulating layer 540 formed on the substrate 510 to bury a lower portion of the light emission layer 530, and an upper electrode 550 formed to cover the light emission layer 530 and the insulating layer 540.

In more detail, an amorphous substrate such as a glass substrate may be used as the substrate 510, or a crystal substrate may be also used. The lower electrode 512 is formed to be separated from the substrate 510 with a predetermined interval. On the other hand, although not shown in FIG. 9, a supporting member for supporting the lower electrode 512 is disposed on the substrate 510. The lower electrode 512 disposed to be separated from the substrate 510 may perform as an electrode in the light emitting device, and at the same time, performs as a micro-heater for providing heat for growing the light emission layer 530 when the light emission layer 530 is formed. That is, when a voltage is applied to the lower electrode 512, the lower electrode 512 generates heat, and the heated lower electrode 512 provides the temperature, at which the group III-V compound semiconductor material forming the light emission layer 530 may be grown. The lower electrode 512 performing as the micro-heater may be formed of, for example, molybdenum (Mo), tungsten (W), or silicon carbide (SiC). However, the exemplary embodiment is not limited thereto.

The buffer layer 520 is formed on the lower electrode 512. The buffer layer 520 may be formed of a material including carbons having hexagonal crystal structures. In the present exemplary embodiment, the buffer layer 520 may be formed of graphene or graphite. The buffer layer 520 formed of the graphene or graphite may be formed by being transferred or grown. When the buffer layer 520 is formed by the growth, a catalyst layer (not shown) may be further formed on a lower surface of the buffer layer 520. On the other hand, although not shown in FIG. 9, a resistive layer may be additionally formed on the lower electrode 512 in order to prevent excessive current from inducing into the light emission layer 530 from the lower electrode 512.

The light emission layer 530 is formed on the buffer layer 520 that is formed of the graphene or graphite. The light emission layer 530 may be formed by growing a group III-V compound semiconductor material such as GaN on the buffer layer 520. When growing the light emission layer 530, the temperature required to grow the light emission layer 530 is provided by the lower electrode 512 functioning as the micro-heater, as described above. Here, the light emission layer 530 may be formed as a film or a plurality of rods according to the type of graphene or graphite forming the buffer layer 520. The light emission layer 530 may include a first semiconductor layer 531 formed on the buffer layer 520, an active layer 532 formed on the first semiconductor layer 531, and a second semiconductor layer 533 formed on the active layer 532. Here, the first semiconductor layer 531 may be a p-type semiconductor layer and the second semiconductor layer 533 may be an n-type semiconductor layer. Otherwise, the first semiconductor layer 531 may be an n-type semiconductor layer and the second semiconductor layer 533 may be a p-type semiconductor layer. The active layer 532 may be a semiconductor layer having a multi-quantum well structure.

The insulating layer 540 is formed on the substrate 520 to bury the lower portion of the light emission layer 530. Here, the insulating layer 540 fills a space between the substrate 510 and the lower electrode 512. The insulating layer 540 may be formed of, for example, photoresist, polyimide, or silicon oxide. However, the exemplary embodiment is not limited thereto. In addition, the upper electrode 550 is formed on upper surfaces of the light emission layer 530 and the insulating layer 540. The upper electrode 550 is formed to cover the second semiconductor layer 533 and the insulating layer 540. The upper electrode 550 may be formed of a transparent conductive material such as ITO. Although not shown in FIG. 9, the wetting layer 125 illustrated in FIG. 2 may be additionally formed on the buffer layer 520.

Figure 10:
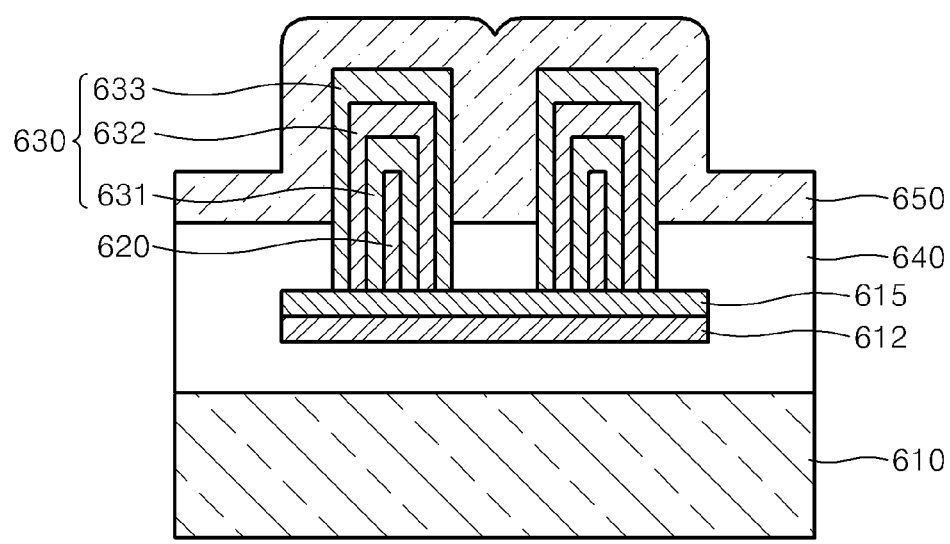
FIG. 10 is a cross-sectional view of a light emitting device according to an exemplary embodiment.

FIG. 10 is a cross-sectional view of a light emitting device according to another exemplary embodiment.

Referring to FIG. 10, the light emitting device of the present exemplary embodiment includes a substrate 610, a lower electrode 612 formed on upper portion of the substrate 610, a buffer layer 620 formed on the lower electrode 612, a light emission layer 630 formed on the buffer layer 620, an insulating layer 640 formed on the substrate 620 to bury a lower portion of the light emission layer 630, and an upper electrode 650 formed to cover the light emission layer 630 and the insulating layer 640.

The lower electrode 612 is disposed to be separated from the substrate 610 with a predetermined interval. On the other hand, although not shown in FIG. 10, a supporting member for supporting the lower electrode 612 is disposed on the substrate 610. The lower electrode 612 performs as a microheater for providing the heat for growing the light emission layer 630 when the light emission layer 630 is formed, as well as an electrode in the light emitting device, as described above. In addition, although not shown in FIG. 10, a resistive layer may be additionally formed on the lower electrode 612. A catalyst layer 615 for growing CNTs is formed on the lower electrode 612. The catalyst layer 615 may be formed of, for example, Cu, Ni, or Invar that is an alloy of Fe and Ni; however, the exemplary embodiment is not limited thereto. The buffer layer 620 is formed on the catalyst layer 615. The buffer layer 620 may be formed of a material including carbons having hexagonal crystal structures. In the present exemplary embodiment, the buffer layer 620 may be formed of the CNTs. The buffer layer 620 may be formed by growing the CNTs on the catalyst layer 615.

The light emission layer 630 is formed on the buffer layer 620 that is formed of the CNTs. The light emission layer 630 may be formed by growing a group III-V compound semiconductor material such as GaN on the buffer layer 620. Here, the light emission layer 630 may be formed to surround or cover the CNTs that form the buffer layer 620. The light emission layer 630 may include the first semiconductor layer 631 formed on the buffer layer 620, an active layer 632 formed on the first semiconductor layer 631, and a second semiconductor layer 633 formed on the active layer 632. Here, the first semiconductor layer 631 may be a p-type semiconductor layer and the second semiconductor layer 633 may be an n-type semiconductor layer. Otherwise, the first semiconductor layer 631 may be an n-type semiconductor layer and the second semiconductor layer 633 may be a p-type semiconductor layer. The active layer 632 may be a semiconductor layer having a multi-quantum well structure.

The insulating layer 640 is formed on the substrate 610 to bury the lower portion of the light emission layer 630. Here, the insulating layer 640 fills the space between the substrate 610 and the lower electrode 612. The upper electrode 650 formed of a transparent conductive material is formed on upper surfaces of the light emission layer 630 and the insulating layer 640. On the other hand, although not shown in FIG. 10, the wetting layer 225 illustrated in FIG. 5 may be additionally formed on the buffer layer 620.

According to the exemplary embodiments, the semiconductor compound layer such as a GaN layer that is epitaxially grown on the amorphous substrate such as the glass substrate may be formed by using the graphene or CNTs. Accordingly, fabrication costs of the semiconductor device such as the light emitting device may be reduced, and the semiconductor device of large area may be fabricated.

It should be understood that the exemplary embodiments described therein should be considered in a descriptive sense only and not for purposes of limitation. Descriptions of features or aspects within each exemplary embodiment should typically be considered as available for other similar features or aspects in other embodiments.

What is claimed is:

1. A semiconductor device comprising:
 a substrate having a first surface;
 a lower electrode disposed above the first surface of the substrate;
 a buffer layer disposed on the lower electrode and above the first surface of the substrate, and comprising carbons having hexagonal crystal structures;
 a light emission layer formed on the buffer layer, and formed of a semiconductor compound;
 an insulating layer formed to bury a lower portion of the light emission layer on the buffer layer; and
 an upper electrode formed to cover the light emission layer and the insulating layer.

2. The semiconductor device of claim 1, further comprising a wetting layer formed on the buffer layer for depositing the light emission layer.

3. The semiconductor device of claim 1, wherein the light emission layer comprises a first semiconductor layer formed on the buffer layer, an active layer formed on the first semiconductor layer, and a second semiconductor layer formed on the active layer.

4. The semiconductor device of claim 1, wherein the light emission layer comprises a group III-V compound semiconductor material.

5. The semiconductor device of claim 1, wherein the buffer layer comprises graphene or graphite.

6. The semiconductor device of claim 5, wherein the light emission layer is formed as a plurality of rods.

7. The semiconductor device of claim 1, wherein the buffer layer comprises carbon nanotubes (CNTs).

8. The semiconductor device of claim 7, wherein the light emission layer is formed to cover the CNTs.

9. The semiconductor device of claim 1, further comprising a resistive layer between the lower electrode and the buffer layer.

10. The semiconductor device of claim 1, further comprising a catalyst layer on the lower electrode for forming the buffer layer.

11. The semiconductor device of claim 1, wherein the lower electrode is formed on an upper surface of the substrate.

12. The semiconductor device of claim 1, wherein the lower electrode is disposed to be separated from the substrate, and the insulating layer fills a space between the substrate and the lower electrode.

* * * * *